United States Patent
Shih

(10) Patent No.: US 9,330,923 B1
(45) Date of Patent: May 3, 2016

(54) NON-VOLATILE MEMORY AND METHOD OF MANUFACTURING THE SAME

(71) Applicant: UNITED MICROELECTRONICS CORP., Hsin-Chu (TW)

(72) Inventor: Ping-Chia Shih, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/576,227

(22) Filed: Dec. 19, 2014

(51) Int. Cl.
*H01L 21/336* (2006.01)
*H01L 21/28* (2006.01)
*H01L 27/115* (2006.01)

(52) U.S. Cl.
CPC .... *H01L 21/28273* (2013.01); *H01L 27/11521* (2013.01)

(58) Field of Classification Search
CPC ....... H01L 27/222; H01L 27/24; H01L 45/04; H01L 2924/1443
USPC ........................................................ 438/257
See application file for complete search history.

(56) References Cited

U.S. PATENT DOCUMENTS

2005/0258463 A1* 11/2005 Yaegashi ............... H01L 27/115
257/296

OTHER PUBLICATIONS

NXP, "NXP 90nm eNVM process technology", Feb. 1, 2012.
Ming-Te Lai et al., "Special SAB etching", Invention disclosure, Nov. 27, 2013, p. 1-9.

* cited by examiner

*Primary Examiner* — Elias M Ullah
(74) *Attorney, Agent, or Firm* — Winston Hsu; Scott Margo

(57) ABSTRACT

A semiconductor process includes the steps of providing a semiconductor substrate with a logic region and a memory region, defining memory gates on the memory region, forming a conformal spacer layer on the memory gates and the semiconductor substrate, and performing an etch process on the conformal spacer layer, such that the conformal spacer layer on sidewalls of the memory gates transforms into spacers, and the conformal spacer layer between the memory gates transforms into a concave block covering the semiconductor substrate between the memory gates.

18 Claims, 5 Drawing Sheets

NON-VOLATILE MEMORY AND METHOD OF MANUFACTURING THE SAME

BACKGROUND OF THE INVENTION

1. Field of the Invention

The present invention generally relates to a non-volatile memory and method of manufacturing the same, and more particularly, to a non-volatile memory with protective block structures for preventing conventional pitting issue and method of manufacturing the same.

2. Description of the Prior Art

A non-volatile memory, such as flash or EEPROM, retains stored data even if power to the memory is removed. A non-volatile memory cell stores data, for example, by storing electrical charge in an electrically isolated memory gate or in a charge-trapping layer underlying a control gate of a field-effect transistor (FET). The stored electrical charge controls the threshold of the FET, thereby controlling the memory state of the cell. A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power applications.

In common non-volatile memory manufacturing processes, the memory gates in memory area (cell) and the logic gates in logic area are usually defined/formed in different steps since the devices in two areas have different components and functionality. The memory gates are usually defined before the logic gates. This step configuration makes the memory devices have high risk to be damaged in the following logic process. The damage issue, which is commonly referred as pitting issue by those ordinarily skilled in the art, is found mainly between memory gates in tight cell area where the hard mask may not properly and uniformly cover and protect the substrate. The poorly-covered substrate between the tightly-spaced memory gates may be easily damaged by following process, such as the poly-Si etching process for forming the logic gates. This pitting issue may impact the overall electrical performance. Accordingly, there is a need for a novel design for non-volatile memory device and methods for preventing the pitting issue in the process in order to improve the performance and reliability of the memory device.

SUMMARY OF THE INVENTION

The present invention has been made in an effort to address the above-mentioned pitting issue that can occur in a conventional memory process. A memory having protective block structures between memory gates is therefore provided in the present invention. The feature of protective block structures between memory gates may effectively protect the substrate from damage by a following process.

One objective of the present invention is to provide a method of manufacturing a non-volatile memory with protective block structures, which primarily includes the steps of providing a semiconductor substrate with a logic area and a memory area, defining memory gates on the memory area, forming a conformal spacer layer on the memory gates and the semiconductor substrate, and performing an etch process on the conformal spacer layer, such that the conformal spacer layer on sidewalls of memory gates transforms into spacers, and the conformal spacer layer between memory gates transforms into a concave block covering the semiconductor substrate between memory gates.

In an alternative aspect, the method of the present invention further includes the step of forming a block structure on the concave block with the material different from the concave block to provide the effect of selective etching between the concave block and the second block.

Another objective of the present invention is to provide a non-volatile memory with protective block structures, which primarily includes the portions of a semiconductor substrate, memory gates on the semiconductor substrate, spacers on sidewalls of memory gates, and concave blocks covering the semiconductor substrate between memory gates, wherein the concave block is lower than the memory gates.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
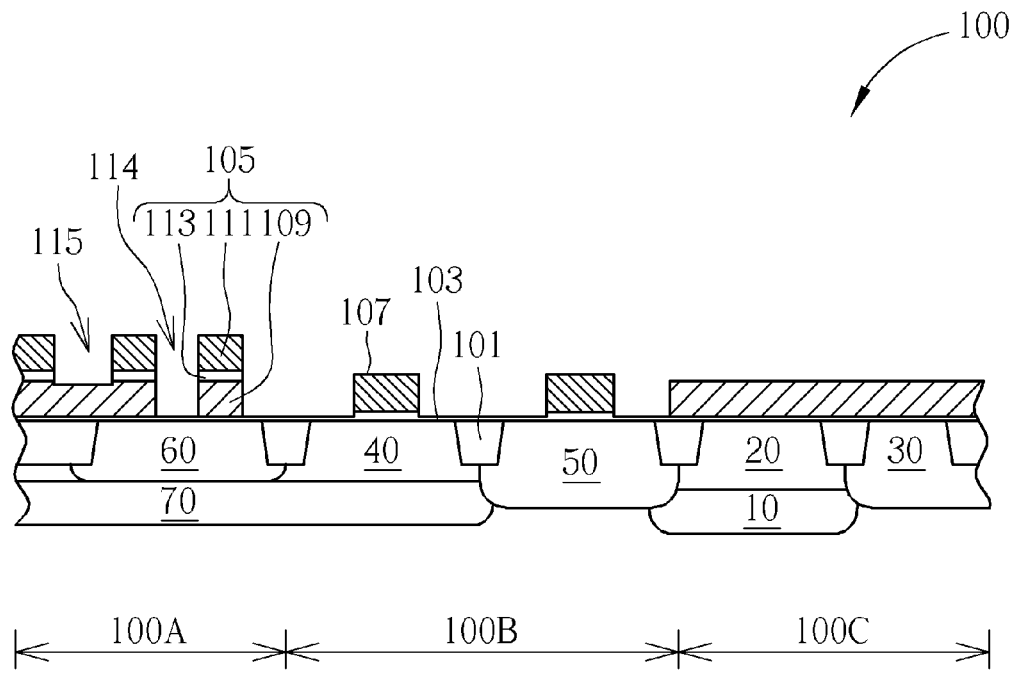
FIGS. 1-6 are cross-sectional views depicting an exemplary process flow of manufacturing a non-volatile memory with protective block between memory gates in accordance with the embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the, regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

FIGS. 1-6 are cross-sectional views depicting an exemplary process flow of manufacturing a non-valitle memory with protective block between memory gates in accordance with the embodiment of the present invention. First, please refer to FIG. 1. Memory cell/device is formed preliminarily on a substrate 100, such as silicon.

The substrate 100 is commonly divided into several regions, such as a memory region 100A, a high-voltage (HV) region 100B, and a logic region 100C. The memory (cell) region 100A of the substrate 100 may be used for memory components. For instance, according to the preferred embodiment, the memory region 100A may be used to form a number of select gate and floating/control gates. High-voltage (HV) and/or logic circuitry may be formed respectively in the HV region 100B and logic regions 100C. The HV region 100B may comprise high voltage control logic and the logic region 100C may comprise low voltage control logic with relatively lower operating voltage. The memory region 100A, the HV region 100B and the logic region 100C or the semiconductor devices formed on each region are isolated from each other by shallow trench isolation (STI) 101 with, for example, a trench depth 365 nm and corner rounding treatment.

In addition to the region division, each region is doped with necessary well portions by ion implantation, such as deep N-type well (DNW) 10, P-type well (PW) 20 and N-type well (NW) 30 in the logic region 100C, HV P-type well (HPW) 40 and HV N-type well (HNW) 50 in the HV region 100B, tunnel oxide mask (TOM) 60 or tunnel implant mask (TIM) in the memory region 100A, and a common buried N-type well (BNW) 70 in the memory region 100A and the HV region 100B.

Figure 2:
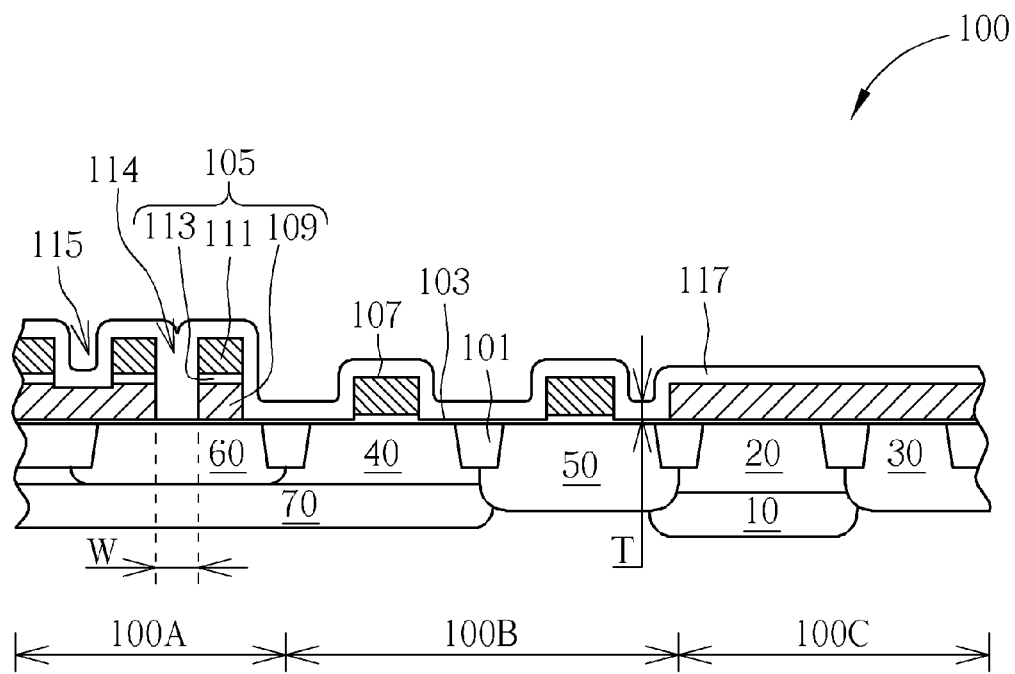

As shown in FIG. 1, a gate dielectric layer 103 is formed on each region 100A-100C. According to the preferred embodiments, the gate dielectric layers 103 on different regions may have different thicknesses as shown in FIG. 2 to meet different device requirements, for example a tunnel oxide (8.3 nm), a thick HV oxide (25 nm) and a thin high-K dielectric (2.1 nm) respectively in memory region 100A, HV region 100B and logic region 100C, but this need not be the case. The gate dielectrics can be any insulating material including but not limited to oxides, nitrides, or some combination thereof. The gate dielectric layer 103 may be formed through any well-known method. For instance, the dielectrics may be grown on the substrate 100 and comprise an oxide of the substrate material (e.g., silicon oxide) by deposition, furnace oxidation, or in-situ steam generation (ISSG), etc.

As shown in FIG. 1, in the preferred embodiment, the memory gates 105 and HV gates 107 are already defined and formed on their respective regions. The memory gates 105 in memory region 100A may be a stack structure having different gate components, such as a lower floating gate 109 and an upper control gate 111, with an oxide/nitride/oxide tri-layer (ONO) 113 sandwiched therebetween. Some memory gates 105 in the memory region 100A are provided with predetermined contact-to-floating gate poly (CFP) holes 115, but are not limited thereto. A gap 114 is formed between each memory gate 105 where the substrate 100 is exposed therefrom.

The material of the floating gate 109 in memory gate stack may be 150 nm fine grains Si with blanket doping. The ONO tri-layer 113 may be, for example, a 65A (angstrom) high temperature thermal oxide (HTO, 780° C.), a 55A silicon nitride, and a 47A hydrous ruthenium oxide (HRO, 780° C.). The control gate 111 in memory gate stack 105 and the HV gate 107 in HV region 100B may be formed from same material of 150 nm fine grain Si layer with blanket implantation and are defined concurrently in one patterning steps. It should be noted that, in this stage, the logic gates on logic region 100C is not defined yet. That means the logic gates in the present invention is not defined concurrently with the memory gates or HV gates in the same patterning process. This makes the preformed devices, especially the tightly-spaced memory gates 105, have high risk of suffering pitting damage by poly-Si etching process for forming the logic gates in later process.

Please refer now to FIG. 2. After the memory gates 105 and HV gates 107 are defined, a conformal spacer layer 117 is formed on the substrate 100. The conformal spacer layer 117 would conformally cover predefined memory gates 105 and HV gates 107. That means the thickness T of conformal spacer layer 117 would be uniform throughout the profile of the substrate 100. The conformal spacer layer 117 may be dielectric layer, such as a 800A TEOS (tetraethyl orthosilicate) layer formed by PECVD. It should be noted that in this embodiment the thickness T of conformal spacer layer 117 is larger than half of the width W of the gap 114 between the memory gates 105 in the memory region 100A. This thickness configuration makes the conformal spacer layer 117 fill up the gap 114 between the memory gates 105 rather than just cover along the profile of the gap 114. The purpose of filling up the gap 114 with a conformal spacer layer 117 between the memory gates 105 is that the merged conformal spacer layer 117 between the memory gates 105 may be transformed into protective block structures in later process.

Figure 3:
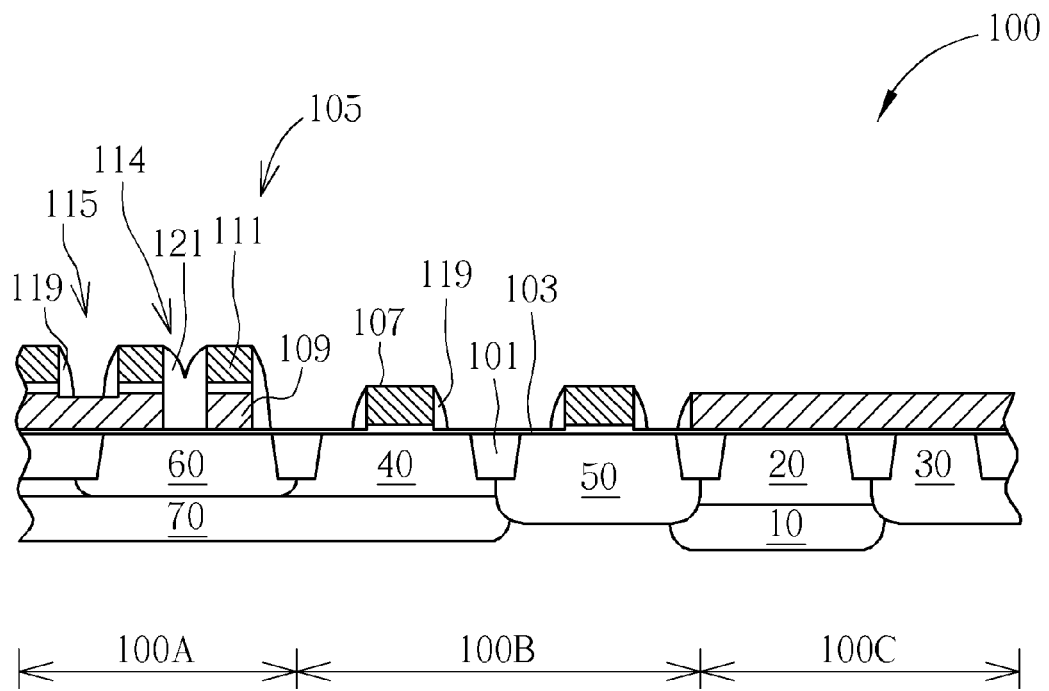
Figure 4:
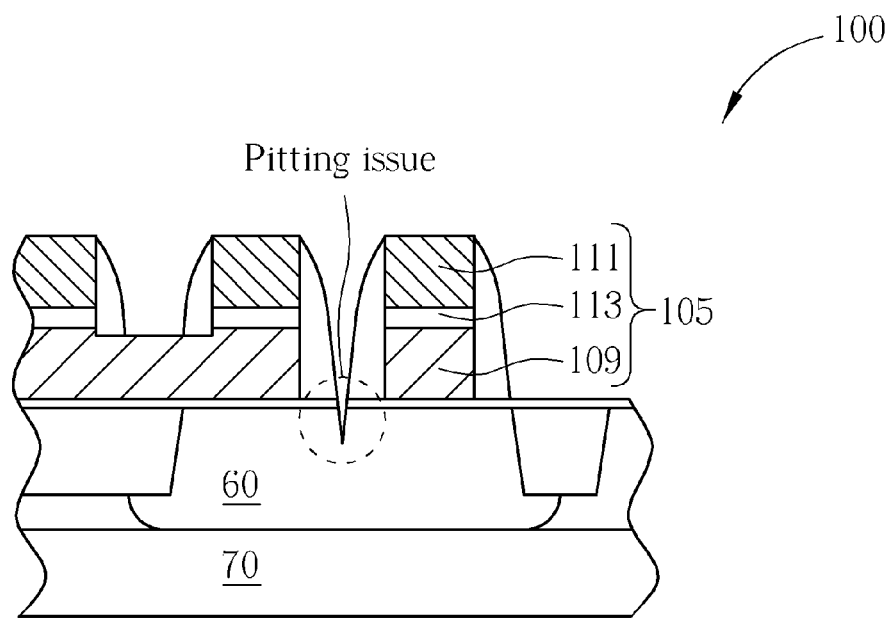

Please refer now to FIG. 3. After the conformal spacer layer 117 is formed, a blanket etch process is performed on the conformal spacer layer 117. The blanket etch process would remove a certain amount of conformal spacer layer 117, preferably the amount of entire vertical thickness T of the conformal spacer layer 117 in this embodiment, such that the conformal spacer layer 117 on sidewalls of the memory gates 105 and HV gates 107 transforms into spacers 119. Most importantly, the conformal spacer layer 117 in the gap 114 between the memory gates 105 would transform into a concave block 121 that covers the substrate 100 between the memory gates 105, rather than forming a regular spacer like the one shown in FIG. 4. This is because the preformed conformal spacer layer 117 between the memory gates 105 "fills up" the gap rather than just conformally covering on the gap, so even though the thickness is reduced by the blanket etching process for forming the spacer, the remaining conformal spacer layer 117 (i.e. concave block 121) in the gap would still cover and protect the surface of the substrate 100 between the memory gates 105. The concave block 121 in this embodiment has a profile similar to two opposite and merged spacers with a concave portion in the midst between the memory gates 105.

Figure 5:
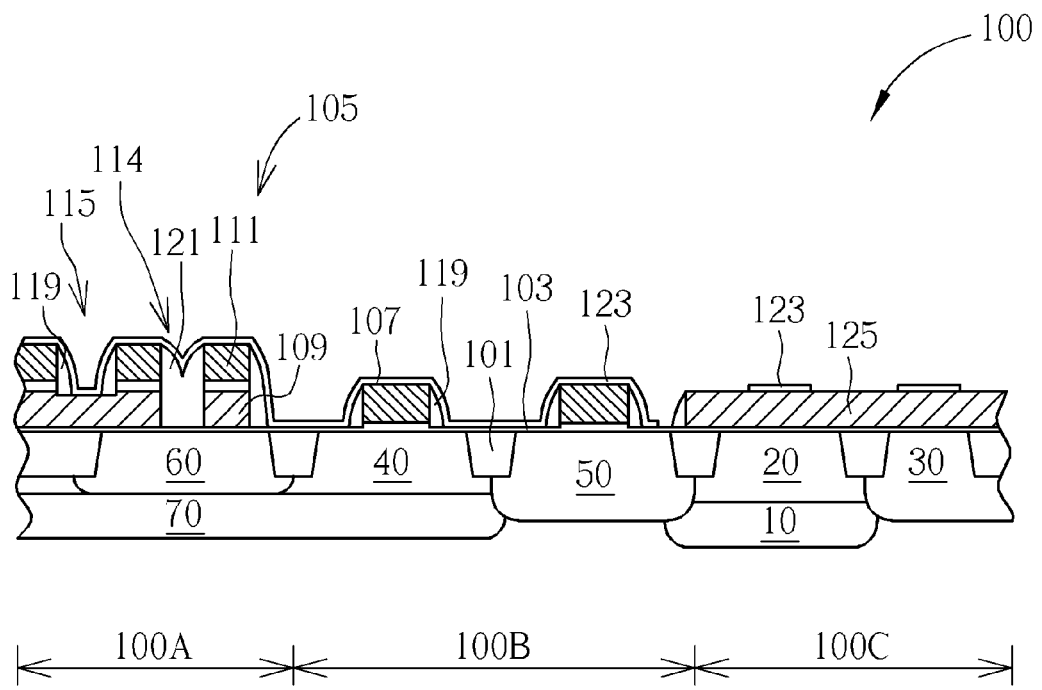

Please refer now to FIG. 5. After the spacers 119 and the protective concave block 121 are formed, the logic gates in logic area 100C are ready to be defined. First, a hard mask layer 123 is conformally formed on the substrate 100. The hard mask layer 123 would conformally cover predefined memory gates 105, HV gates 107, spacers 119, and the concave block 121. After the hard mask layer 123 is formed, a photolithographic process is performed to pattern the hard mask layer 123 in logic region 100C. The patterned hard mask layer 123 defines the pattern of logic gates in logic region 100C. It is shown in FIG. 5 that entire memory region 100A and HV region 100B with pre-defined gate patterns are covered by the hard mask layer 123.

Figure 6:
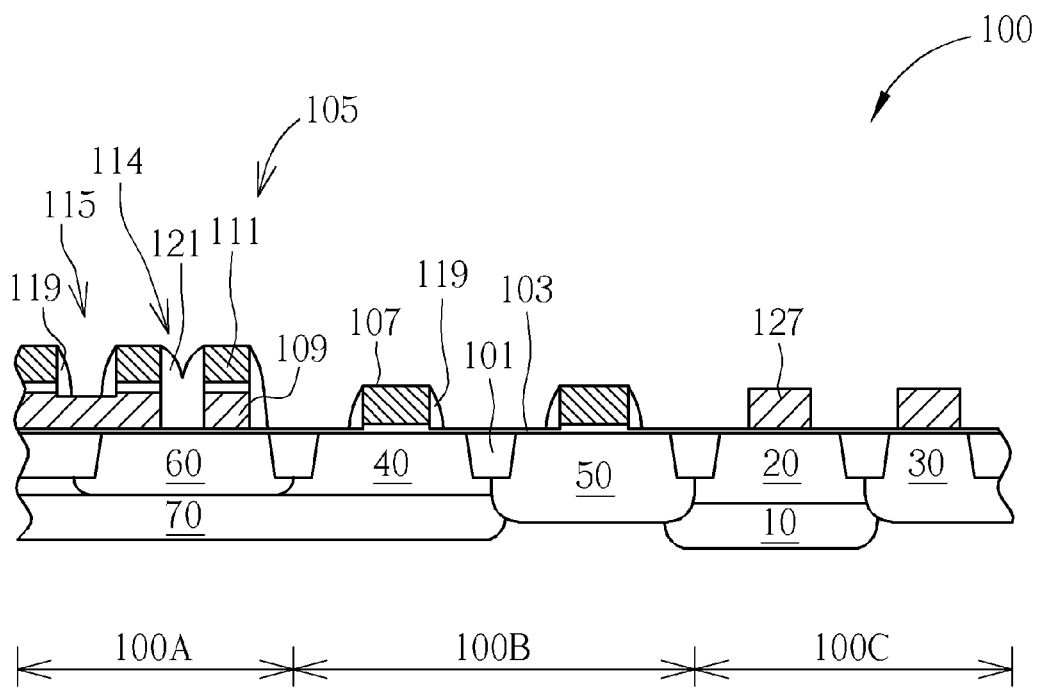

Please refer now to FIG. 6. After the patterned hard mask layer 123 is formed, an etching process is performed by using the patterned hard mask layer 123 as a mask to transfer the pattern of logic gates to the underlying conductive layer, thereby forming the logic gates 127. The remaining hard mask layer 123 may be removed after the logic gates 127 are defined. It should be noted that since the substrate 100 between the memory gates 105 in memory region 100A is protected by predetermined concave blocks 121, there is no risk of suffering substrate pitting damage between tight-spaced memory gates 105 due to poorly-covered hard mask layer 123 in that region, and the spacers 119 may still be formed as usual on the sidewalls of the gate structure in the process of the present invention.

In addition to the above first embodiment which dedicates to form protective block structure in tight memory region, the present invention also provides a second embodiment with similar efficacy. Unlike the first embodiment which uses a relatively thick spacer layer to form the protective block structure, the second embodiment uses a spacer layer with normal thickness like those used to form normal spacers in prior art.

Figure 7:
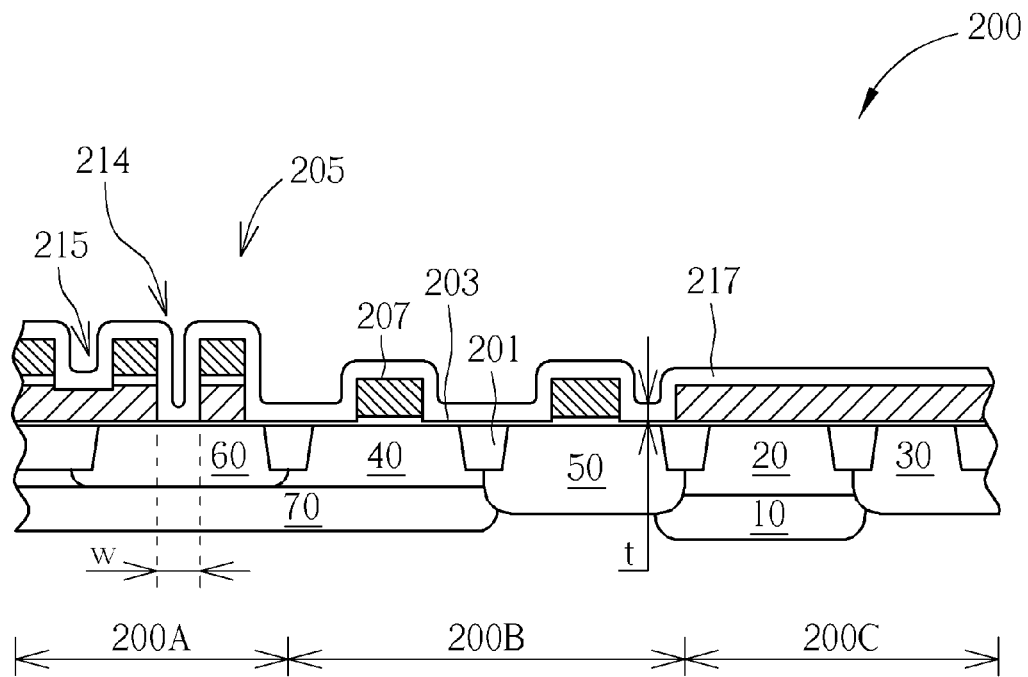
FIGS. 7-10 are cross-sectional views depicting another exemplary process flow of manufacturing a non-volatile memory with protective block between memory gates in accordance with the embodiment of the present invention.

FIGS. 7-11 are cross-sectional views depicting an exemplary process flow of manufacturing a non-volatile memory with protective block between memory gates in accordance with the second embodiment of the present invention. First, please refer to FIG. 7. The same substrate 200 with predefined memory gates 205, HV gates 207 and predefined memory region 200A, HV region 200B and logic region 200C is provided like the substrate 100 shown in FIG. 1. First, a conformal spacer layer 217 is formed on the substrate 200. The conformal spacer layer 217 may be a dielectric layer, such as a 500A TEOS (tetraethyl orthosilicate) layer formed by PECVD and is designed to conformally cover predefined memory gates 205 and HV gates 207. It should be noted that in this embodiment, the thickness t of the conformal spacer layer 217 depends on the width of the spacer to be formed, and it should be smaller than half of the width W of the gap between the memory gates 205 in the memory region 100A. Thus the conformal spacer layer 117 would not fill up the gap between the memory gates 205, as shown in FIG. 7. A narrow gap 214 with high aspect ratio is formed between the memory gates 205.

Figure 8:
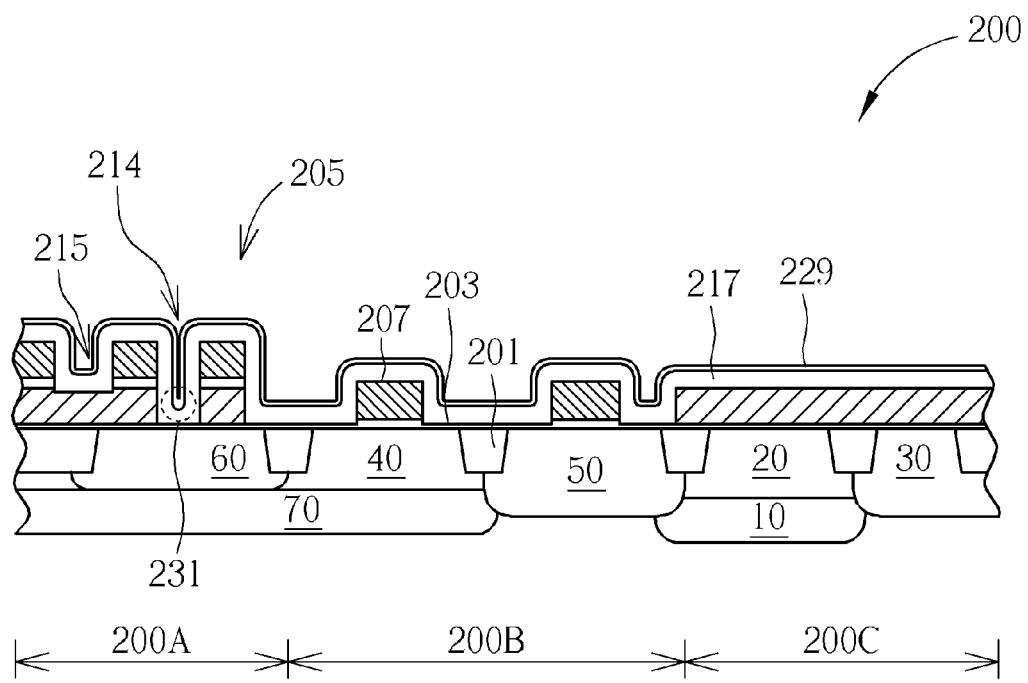

Please refer to FIG. 8. After the conformal spacer layer 217 is formed, an additional conformal block layer 229 is formed on the conformal spacer layer 217. The conformal block layer 229 has relatively thin thickness compared to the conformal spacer layer 217 and it may still not fill up the narrow gap between the memory gates. However, it should be noted that, since the gap 214 is very narrow, the conformal block layer 229 on the bottom of the gap 214 may merge into a block structure 231. The purpose of conformal block layer 229 in this embodiment is to create this kind of block residue on the spacer layer for protecting the substrate thereunder.

Figure 9:
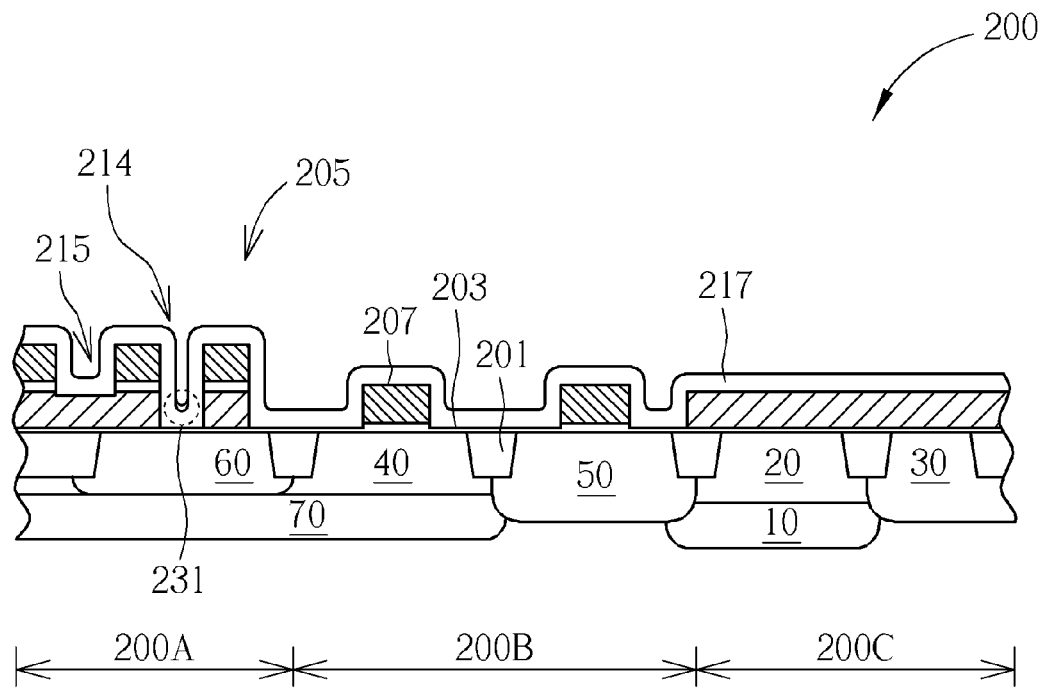

Please refer to FIG. 9. After the conformal block layer 229 is formed, an etch-back process is performed on the conformal block layer 229 to remove the conformal block layer 229 from the conformal spacer layer 217. The etch-back process may use phosphoric acid ($H_3PO_4$) when the conformal block layer 229 is formed of silicon nitride. However, as shown in FIG. 9, please note that the portion of the conformal block layer 229 (i.e. the block structure) on the bottom of gap 214 is not removed like other portions since this portion have merged into a block structure with larger thickness than the original thickness t of the conformal block layer 229.

Figure 10:
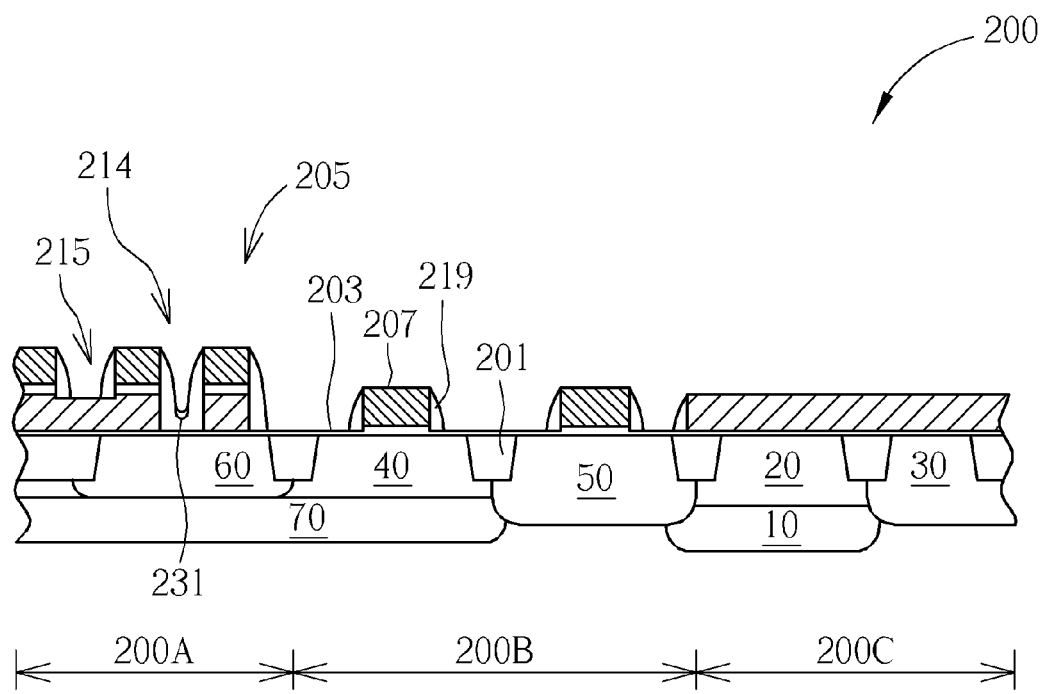

Please refer to FIG. 10. After removing the conformal block layer 229 and forming the block structure 231 in the gap, a blanket etch process is performed on the conformal spacer layer 217. The blanket etch process would remove a certain amount of conformal spacer layer 217, preferably the amount of entire vertical thickness t of the conformal spacer layer 217 in this embodiment, such that the conformal spacer layer 217 on sidewalls of the memory gates 205 and HV gates 207 would transform into spacers 219. Most importantly, since the block structure 231 with different material from the conformal spacer layer 217 blocks in the midst of the gap between the memory gates 205, the block structure/residue 231 would serve as a mask in the blanket etch process for forming the spacers, thus the conformal spacer layer 217 under the block residue 231 would not be removed and the substrate between the memory gates would not be exposed even after the spacer process.

After the spacers 219 and the protective block structure 231 are formed, other memory processes, such as the step of defining logic gates (as shown in FIG. 5 and FIG. 6 in first embodiment), source/drain implant, silicide formation, contact formation, may be performed in regular order to complete the manufacture of the non-volatile memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a non-volatile memory, comprising:
    providing a semiconductor substrate with a logic region and a memory region;
    forming memory gates directly on a gate dielectric in said memory region;
    forming a conformal spacer layer directly on said gate dielectric in said memory gates; and
    performing an etch process to said conformal spacer layer, such that said conformal spacer layer on sidewalls of said memory gates transforms into spacers, and said conformal spacer layer between said memory gates transforms into a concave block covering said gate dielectric between said memory gates.

2. The method of manufacturing a non-volatile memory of claim 1, wherein said conformal spacer layer between said memory gates fills up a gap between said memory gates.

3. The method of manufacturing a non-volatile memory of claim 2, wherein the thickness of said conformal spacer layer is larger than half of the width of said gap between said memory gates on said memory region.

4. The method of manufacturing a non-volatile memory of claim 1, further comprises forming a conformal block layer on said conformal spacer layer, wherein the material of said conformal block layer and said conformal spacer layer are different.

5. The method of manufacturing a non-volatile memory of claim 4, further comprises performing an etch-back process to said conformal block layer, such that said conformal block layer is completely removed except the portion between said memory gates, and said conformal block layer between said memory gates transforms into a block structure.

6. The method of manufacturing a non-volatile memory of claim 4, wherein the thickness of said conformal spacer layer is smaller than half of the width of said gap between said memory gates on said memory region.

7. The method of manufacturing a non-volatile memory of claim 4, wherein said conformal block layer is silicon nitride layer.

8. The method of manufacturing a non-volatile memory of claim 1, further comprises forming a hard mask layer on said semiconductor substrate after said spacers and said concave blocks are formed, wherein said hard mask layer defines the pattern of logic gates on said logic region and covers said memory gate, said spacer and said concave block.

9. The method of manufacturing a non-volatile memory of claim 8, further comprises performing an etching process using said hard mask layer as a mask to form logic gates on said logic region.

10. The method of manufacturing a non-volatile memory of claim 1, wherein said conformal spacer layer is silicon oxide layer.

11. The method of manufacturing a non-volatile memory of claim 1, wherein each said memory gate comprises a floating gate, a nitride/oxide/nitride tri-layer, and a control gate.

12. The method of manufacturing a non-volatile memory of claim 1, wherein said memory gate comprises a control gate, a floating gate or a select gate.

13. A non-volatile memory, comprising:
    a semiconductor substrate;
    memory gates directly on a gate dielectric of said semiconductor substrate;
    spacers on sidewalls of said memory gates; and
    a concave block directly covering said gate dielectric of said semiconductor substrate between each said memory gate, wherein said concave block is lower than said memory gate.

14. The non-volatile memory of claim 13, further comprises a block structure filling in the gap on each said concave blocks, wherein the material of said block structure and said concave block are different.

15. The non-volatile memory of claim 14, wherein the material of said block structure is silicon nitride.

16. The non-volatile memory of claim 13, wherein the material of said spacers and said concave blocks are silicon oxide.

17. The non-volatile memory of claim 13, wherein each said memory gate comprises a floating gate, a nitride/oxide/nitride tri-layer, and a control gate.

18. The non-volatile memory of claim 13, wherein said memory gate comprises a control gate, a floating gate or a select gate.

* * * * *